United States Patent
Bhattacharyya

(10) Patent No.: US 10,411,026 B2
(45) Date of Patent: Sep. 10, 2019

(54) INTEGRATED COMPUTING STRUCTURES FORMED ON SILICON

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 15/641,558

(22) Filed: Jul. 5, 2017

(65) Prior Publication Data

US 2019/0013323 A1    Jan. 10, 2019

(51) Int. Cl.

| | |
|---|---|
| *H01L 27/11568* | (2017.01) |
| *H01L 21/28* | (2006.01) |
| *H01L 21/762* | (2006.01) |
| *H01L 21/8238* | (2006.01) |
| *H01L 21/285* | (2006.01) |
| *H01L 27/092* | (2006.01) |
| *H01L 29/06* | (2006.01) |

(Continued)

(52) U.S. Cl.
CPC .. *H01L 27/11568* (2013.01); *H01L 21/28282* (2013.01); *H01L 21/28518* (2013.01); *H01L 21/76229* (2013.01); *H01L 21/823814* (2013.01); *H01L 21/823871* (2013.01); *H01L 23/535* (2013.01); *H01L 27/092* (2013.01); *H01L 27/11573* (2013.01); *H01L 29/0649* (2013.01); *H01L 29/0847* (2013.01); *H01L 29/4234* (2013.01); *H01L 29/42364* (2013.01); *H01L 29/456* (2013.01); *H01L 21/823857* (2013.01); *H01L 21/823878* (2013.01)

(58) Field of Classification Search
None
See application file for complete search history.

(56) References Cited

U.S. PATENT DOCUMENTS

| | | |
|---|---|---|
| 4,870,470 A | 9/1989 | Bass et al. |
| 6,743,681 B2 | 6/2004 | Bhattacharyya |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Thien F Tran
(74) *Attorney, Agent, or Firm* — Brooks, Cameron & Huebsch, PLLC

(57) ABSTRACT

The present disclosure includes methods of forming, and semiconductor structures for, integrated computing structures formed on silicon. An example method includes forming, on a silicon semiconductor material, an integrated computing structure by forming a number of complementary metal-oxide-semiconductor (CMOS) devices including a plurality of materials, forming a non-volatile memory (NVM) device including a plurality of materials, and forming the plurality of materials of the CMOS devices and the plurality of materials of the NVM device from a plurality of same materials shared at a corresponding plurality of positions within the structure. A particular function is provided by each of the plurality of same materials at the corresponding plurality of positions.

20 Claims, 3 Drawing Sheets

(51) Int. Cl.
*H01L 29/08* (2006.01)
*H01L 29/45* (2006.01)
*H01L 23/535* (2006.01)
*H01L 29/423* (2006.01)
*H01L 27/11573* (2017.01)

(56) References Cited

U.S. PATENT DOCUMENTS

| | | | |
|---|---|---|---|
| 6,743,682 B2 | 6/2004 | Woerlee et al. | |
| 6,888,200 B2 | 5/2005 | Bhattacharyya | |
| 6,903,969 B2 | 6/2005 | Bhattacharyya | |
| 6,917,078 B2 | 7/2005 | Bhattacharyya | |
| 6,998,667 B2 | 2/2006 | Bhattacharyya | |
| 7,012,297 B2 | 3/2006 | Bhattacharyya | |
| 7,042,027 B2 | 5/2006 | Bhattacharyya | |
| 7,130,216 B2 | 10/2006 | Bhattacharyya | |
| 7,145,186 B2 | 12/2006 | Bhattacharyya | |
| 7,158,410 B2 | 1/2007 | Bhattacharyya et al. | |
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2 | 12/2009 | Bhattacharyya | |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2 | 2/2012 | Bhattacharyya | |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 8,883,624 B1* | 11/2014 | Ramkumar | H01L 21/28282 438/587 |
| 2002/0081826 A1* | 6/2002 | Rotondaro | H01L 21/28185 438/585 |
| 2007/0034922 A1 | 2/2007 | Bhattacharyya | |
| 2008/0303080 A1 | 12/2008 | Bhattacharyya | |
| 2010/0090265 A1 | 4/2010 | Bhattacharyya et al. | |

OTHER PUBLICATIONS

Bhattacharyya et al., "Properties and Applications of Silicon Oxynitride Films", from IBM Technical Report TR. 19.0399, presented at the Electrochemical Society (ECS) 150th Meeting, Oct. 1976, Las Vegas, NV, 20 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "Cmos Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

(56) References Cited

OTHER PUBLICATIONS

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 645-648.

Lue et al., "A Novel P-Channel NAND-type Flash Memory with 2 bit/cell Operation and High Programming Throughput (>20 Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr-AlSi-O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p- MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable Monos Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al. "Novel ZrO2/Si3N4 Dual Charge Storage Layer to Form Step-up Potential Wells for Highly Reliable Multi-level Cell Application", IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

* cited by examiner

US 10,411,026 B2

INTEGRATED COMPUTING STRUCTURES FORMED ON SILICON

TECHNICAL FIELD

The present disclosure relates generally to semiconductor devices and, more particularly, to integrated computing structures formed on silicon.

BACKGROUND

Integration of electronic circuits and/or memory devices involves connecting a specific electronic active element, (e.g. a transistor) with an appropriate passive element (e.g., a resistor or a capacitor) to form, for example, a unit memory cell. Appropriate integration of active and passive elements properly connected and isolated may contribute to, for instance, multiple units of logic circuitry being included in an array of memory cells. Such integration on a single semiconductor substrate may contribute to a functional device, such as a processor chip, to execute logical functions and/or memory for data storage.

DETAILED DESCRIPTION

Non-volatile memory (NVM) devices may include an array of memory cells for storage of data and peripheral circuits for accessing and/or controlling data in the array. Within the array, each memory cell may be electrically isolated from adjacent memory cells. The degree to which large numbers of memory cells can be integrated on and/or in a single silicon substrate (e.g., an integrated circuit (IC) chip) may depend, among other things, on an appropriate nature (e.g., type, degree, etc.) of isolation between the memory cells. Similarly, in metal-oxide-semiconductor (MOS) technology, isolation may be provided between adjacent devices, such as negative channel MOS (NMOS) transistors or positive channel MOS (PMOS) transistors and/or complementary MOS devices (a CMOS circuit) (e.g., to prevent parasitic channel formation). An NMOS transistor and a PMOS transistor may be field effect transistors (FET) that in combination form a portion of a MOSFET CMOS.

Shallow trench isolation (STI) is one technique that may be implemented to isolate devices, such as memory cells and/or transistors, from one another. For instance, STI formation may include formation of (e.g., etching) a trench into a semiconductor material, such as a crystalline silicon substrate, for a semiconductor device. In some instances, further isolation may be provided (e.g., as potentially required) by implementation of a deep trench isolation (DTI) technique to appropriately isolate logic circuitry from an array of memory cells formed on the same silicon substrate (e.g., a DTI structure between CMOS device circuitry and an NVM device). NMOS transistors and PMOS transistors of CMOS devices may operate using lower voltages than used for NVM devices. As such, an STI structure may be appropriate between an NMOS transistor and a PMOS transistor, whereas greater isolation provided by a DTI structure may be appropriate between an NMOS transistor and/or a PMOS transistor and an NVM device, although, in a number of embodiments, alternative use and/or positioning of STI and DTI structures are envisioned herein. For example, for NMOS transistors or PMOS transistors of CMOS devices and/or for NVM devices there may be STI and/or DTI structures, other than those shown between them in FIGS. 2A-2C of the present disclosure, formed for further isolation (e.g., on an opposite side thereof). An oxide, for instance, a high density plasma oxide, may be deposited to fill the trench of the STI and/or DTI structures, which may be heated to densify the deposited oxide to provide an effective isolation structure in the form of the trench within the silicon substrate.

Figure 1A:
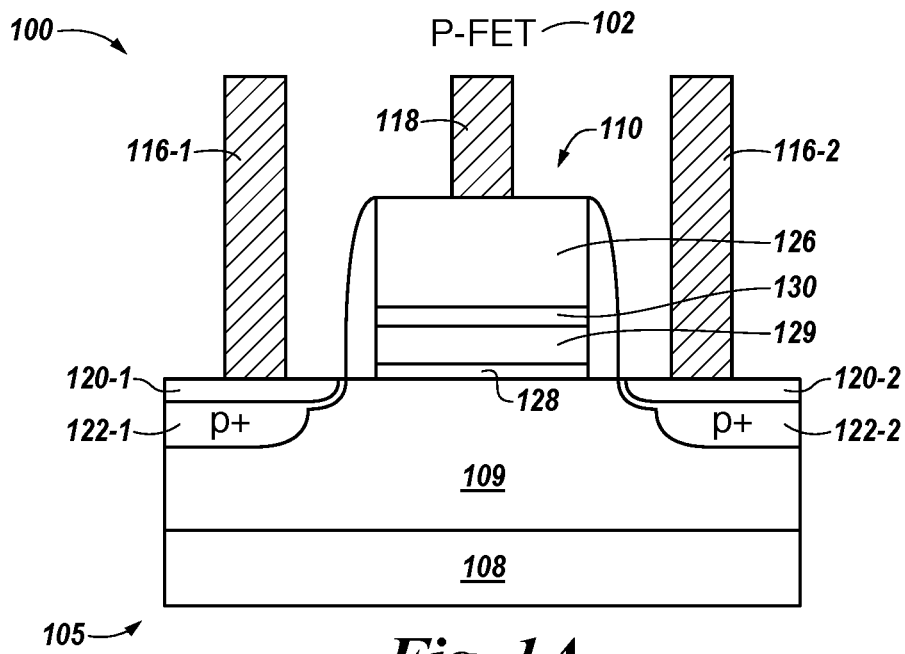
FIGS. 1A-1C are each a cross-sectional view of a portion of an embodiment of an integrated computing structure in accordance with a number of embodiments of the present disclosure.
Figure 1B:
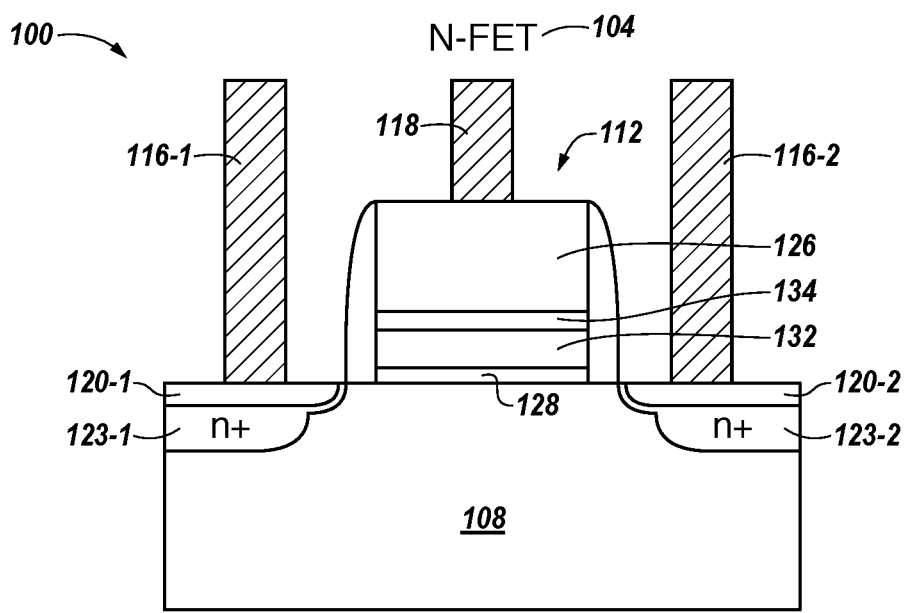
Figure 1C:
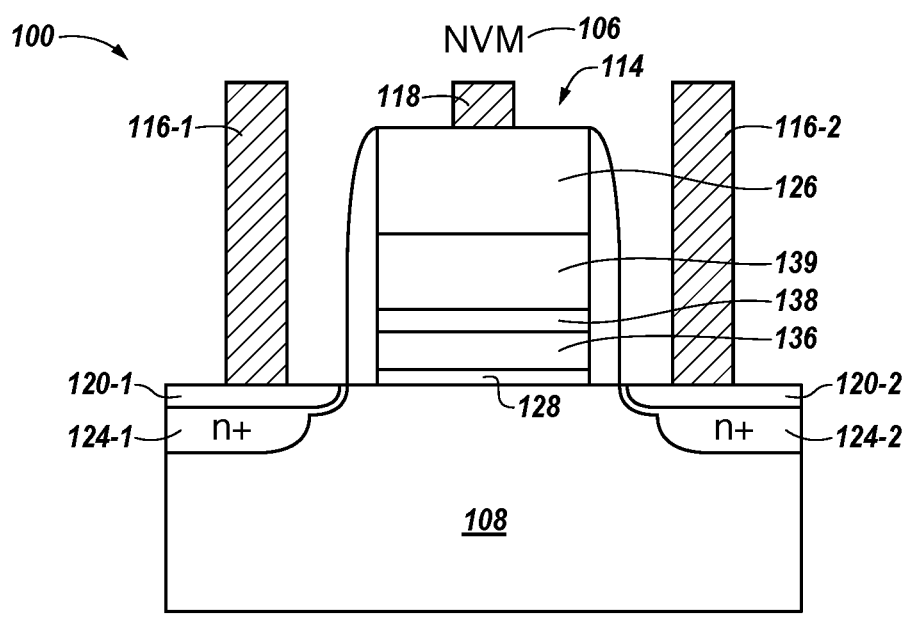

FIGS. 1A-1C are each a cross-sectional view of a portion of an embodiment of an integrated computing structure 100 in accordance with a number of embodiments of the present disclosure. The integrated computing structure 100, as described herein may include a CMOS FET structure 105, as shown and described in connection with FIGS. 1A and 1B, integrated with a FET-based NVM structure, as shown and described in connection with FIG. 1C.

Figure 2A:
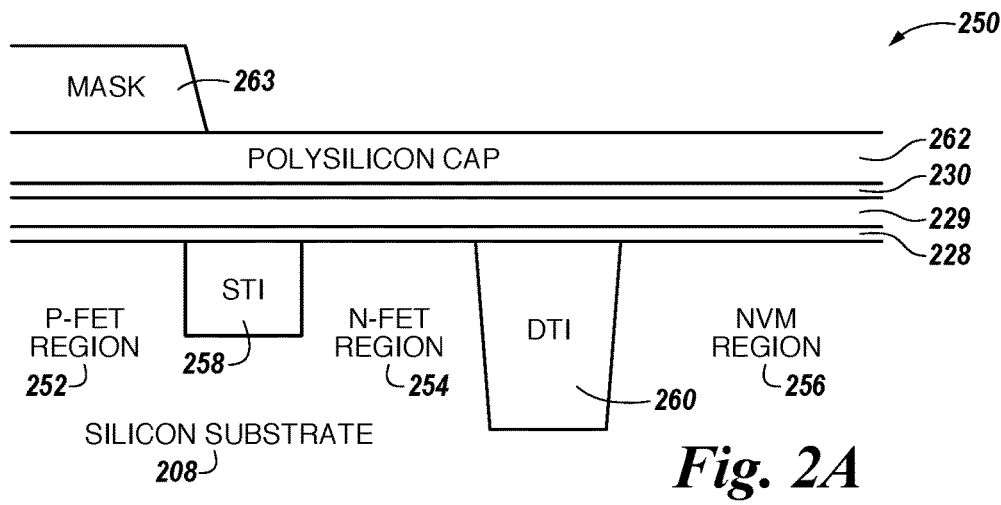
FIGS. 2A-2C are cross-sectional views of a processing sequence for integration of memory devices and associated structures on a silicon semiconductor material in accordance with a number of embodiments of the present disclosure.
Figure 2B:
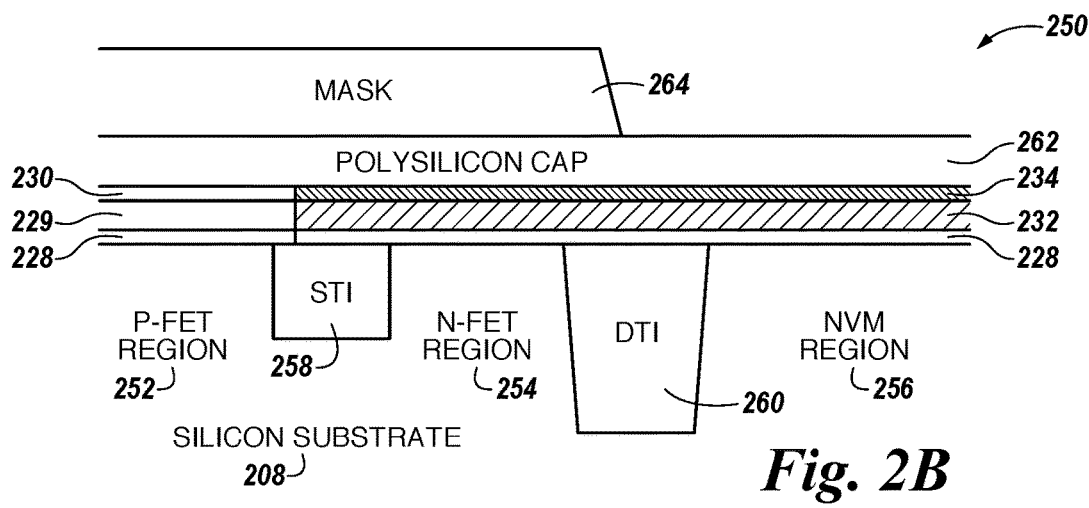
Figure 2C:
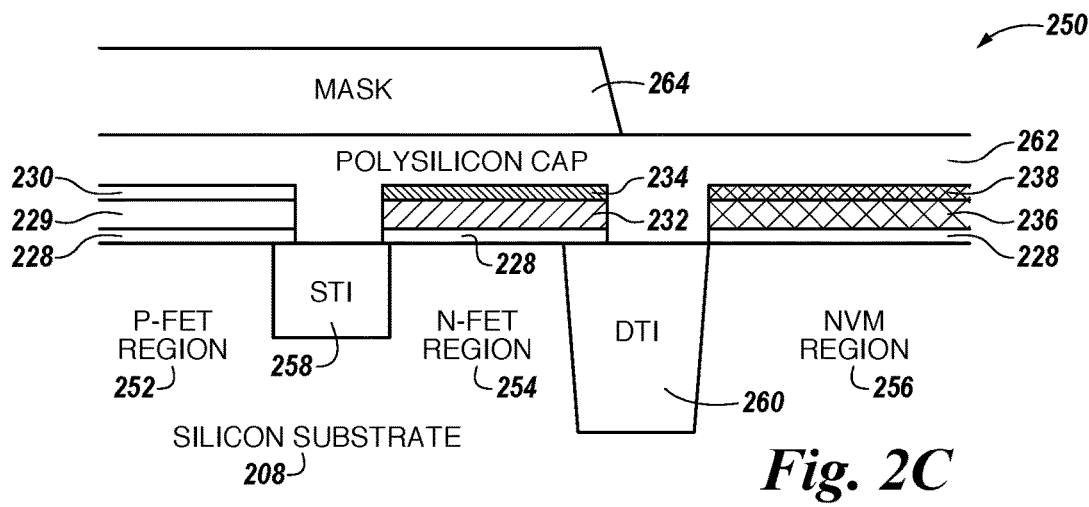

The present disclosure includes specific memory devices and associated structures as integrated computing structures 100 on a single silicon material (e.g., a substrate as shown at 108 in FIGS. 1A-1C and/or 208 in FIGS. 2A-2C). The memory devices and associated components (e.g., transistors) may be formed (e.g., integrated) on the silicon semiconductor material 108. In a number of embodiments, the single silicon material 108 may be formed from a single crystal silicon, a polycrystalline silicon (polysilicon) material, and/or a silicon on insulator (SOI) structure. The memory devices and associated components (e.g., with compatible structures) of the integrated computing structure 100 may, in a number of embodiments, include a number of P-FET devices (e.g., as shown at 102 and described in connection with FIG. 1A), a number of N-FET devices (e.g., as shown at 104 and described in connection with FIG. 1B), and/or a number of NVM devices (e.g., FET-based NVM devices as shown at 106 and described in connection with FIG. 1C, although NVM devices described herein are not limited to being FET-based). The P-FET device 102 includes a PMOS transistor and the N-FET device 104 includes an NMOS transistor. The P-FET device 102 and the N-FET device 104 may be combined to form a CMOS device 105.

An example of a semiconductor structure can include the single silicon semiconductor material 108 having the integrated computing structure 100 formed thereon. The integrated computing structure 100 may include the P-FET device 102 and the N-FET device 104 of the CMOS device 105 formed from a plurality of materials (e.g., layers) and the NVM device 106 formed from a plurality of materials (e.g., layers), as described further herein. The plurality of materials of the CMOS device 105 and the plurality of materials of the NVM device 106 may be formed from, as described further herein, a shared same (e.g., used in common) material in a plurality of materials (e.g., a number of chemical elements and/or a combination of a plurality of chemical elements, and various numbers of each chemical element, to form a chemical compound) at a plurality of corresponding positions in their plurality of materials. Each of the plurality of materials may provide a particular function at the plurality of corresponding positions. Accordingly, the shared same materials utilized to form the corresponding positions in the plurality of materials and to provide the particular functions at the plurality of corresponding positions may reduce complexity in formation of the integrated computing structure 100 (e.g., when utilizing the STI trench structure 258 and/or DTI trench structure 260 shown and described in connection with FIGS. 2A-2C).

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to) being able to, not in a mandatory sense (i.e., must). The term "include," and derivations thereof, means "including, but not limited to". The term "coupled" means to be directly or indirectly connected physically or for access to and movement (transmission) of commands and/or data, as appropriate to the context. The terms "data" and "data values" are used interchangeably herein and can have the same meaning, as appropriate to the context.

"Substrate" as used herein is intended to mean a semiconductor material such as a base semiconductor layer or a semiconductor material having one or more layers, structures, or regions formed thereon. As such, a base semiconductor layer (silicon material) may be the lowest layer of single crystal silicon or a polysilicon material consisting of a silicon wafer or a silicon layer deposited on another material, such as a silicon on sapphire and/or an SOI wafer. For simplicity, a "silicon semiconductor material 108" and/or a "silicon material 108" have been used throughout the present disclosure and these terms are intended to be inclusive of both the p-silicon substrate material 108 and the n-silicon material of well 109 (e.g., in association with the P-FET device 102 shown in and described in connection with FIG. 1A).

"Layer" as used herein can refer to a layer formed on a material (e.g., a substrate) and/or a layer formed on a previously deposited layer using a number of deposition, masking, processing, and thermal techniques, for example, as presented herein. The term "layer" is meant to include layers specific to the semiconductor industry, such as "barrier layer," "dielectric layer," and "conductive layer", among other types of layers. The term "layer" is intended to be synonymous with the term "film", as used in the semiconductor industry. The term "layer" also may include layers found in technology outside of semiconductor technology, such as coatings on glass. "Forming" a material as used herein is intended to include depositing the material (e.g., as a layer) using a suitable deposition technique, as used in the semiconductor industry. A "material" as used herein is intended to include a number of chemical elements and/or a combination of a plurality of chemical elements, and various numbers of each chemical element (e.g., to form a chemical compound), that may be used to form the material (e.g., by depositing the material as a layer).

The figures herein follow a numbering convention in which the first digit or digits correspond to the figure number and the remaining digits identify an element or component in the drawing. Similar elements or components between different figures may be identified by the use of similar digits. For example, 108 may reference element "08" in FIGS. 1A-1C, and a similar element may be referenced as 208 in FIGS. 2A-2C. Multiple analogous elements within one figure may be referenced with a reference numeral followed by a hyphen and another number. For example, 116-1 may reference element 16-1 in FIG. 1A and 116-2 may reference element 16-2, which can be analogous to element 16-1. Such analogous elements may be generally referenced herein without the hyphen and an extra numeral. For example, elements 116-1 and 116-2 may be generally referenced as 116.

Elements shown in the various embodiments herein can be added, exchanged, and/or eliminated so as to provide a number of additional embodiments of the present disclosure. In addition, the proportion and the relative scale of the elements provided in the figures are intended to illustrate certain embodiments of the present invention, and should not be taken in a limiting sense.

FIGS. 1A-1C each illustrate a cross-section of only one device (e.g., memory cell) and associated components (e.g., P-FET device 102, N-FET device 104, and NVM device 106 and associated components of each) in an X-Z plane with the silicon material 108 extending across the X direction only. However, the semiconductor structures contemplated herein may have integrated computing structures 100, along with STI and/or DTI trench structures (e.g., as shown at 258 and 260, respectively, in FIGS. 2A-2C), for a plurality of memory devices extending in both directions of the X-Z plane and a Y-Z plane.

As shown in FIG. 1A, a plurality of materials of the CMOS device 105 may include a P-FET device 102, having a gate insulator stack 110 (including associated components), in the integrated computing structure 100. As shown in FIG. 1B, the plurality of materials of the CMOS device 105 may further include an N-FET device 104, having a gate insulator stack 112 (including associated components), in the integrated computing structure 100. As shown in FIG. 1C, the integrated computing structure 100 may include the NVM device 106 (including associated components), which may be, or may include, a FET-based NVM device that includes a charge trapping material (e.g., a layer shown at 138 that may be formed from a hafnium oxide ($HfO_2$) dielectric). The FET-based NVM device 106 and associated components 114 illustrated in FIG. 1C is shown to have a structure based upon the N-FET device 104 and associated components 112 shown in FIG. 1B; however, embodiments are not limited to this configuration. For example, a FET-based NVM device 106 and associated components 114 may have a structure based upon the P-FET device 102 and associated components 110 shown in FIG. 1A. In a number of embodiments, the FET-based NVM device 106 may be configured to output data values based upon a number of logic functions and/or structures (e.g., NAND, NOR, and/or nitride read-only memory (NROM), among other possibilities).

The P-FET 102 gate insulator stack and associated components 110 formed from a plurality of materials and the N-FET 104 gate insulator stack and associated components 112 formed from a plurality of materials may be coupled as a CMOS device 105 configured to perform compute operations (e.g., add, multiply, and shift, among other compute operations) and/or logical operations (e.g., Boolean operations, among other logical operations). The NVM 106 device stack and associated components 114 formed from a plurality of materials may be configured for non-volatile storage of data values (e.g., results of performance of the compute and/or logical operations by the CMOS device 105).

As shown and described in connection with FIGS. 2A-2C, a number of embodiments of the integrated computing structure 100 may include an STI structure 258 formed between the P-FET 102 gate insulator stack and associated components 110 and the N-FET 104 gate insulator stack and associated components 112 of the CMOS device 105. A DTI structure 260 may be formed between the plurality of materials that form a stack and associated components 114 of the NVM device 106 and the plurality of materials that form the gate insulator stacks and associated components 110, 112 of the CMOS device 105.

In a number of embodiments, the plurality of materials of the P-FET 102 and N-FET 104 gate insulator stacks and associated components 110, 112 and the plurality of materials of the NVM 106 device stack and associated components 114 share a plurality of same materials at a plurality of corresponding positions within the structure to provide a particular function. The shared same materials may, in a number of embodiments, be in at least two of: an interface stabilizing material 128 of the stacks contiguous to the silicon semiconductor material 108; a metal gate 116-1, 116-2, and/or 118, as embodiments of associated components, distal from the silicon semiconductor material 208 (e.g., not contiguous with the silicon semiconductor material 208 of N-FET 104 or NVM 106 and/or a well 109 of P-FET 102; and a metal gate interface 126, as an embodiment of an associated component, contiguous to the metal gate component (e.g., control gates 118) and between the interface stabilizing material 128 and the metal gate component.

The metal gate component may, in a number of embodiments, include a common control gate material of each of the P-FET and N-FET gate insulator stacks and associated components 110, 112 and the NVM device stack and associated components 114 (e.g., control gates 118 of the CMOS device 105 and/or the NVM device 106). The metal gate component also may, in a number of embodiments, include a source gate and a drain gate (e.g., the source gate may be the gate shown at 116-1 and the drain gate may be the gate shown at 116-2, or vice versa) of each of the P-FET 102 and N-FET 104 gate insulator stacks and the NVM 106 device stack.

The shared same (e.g., common) material that provides the function of the metal gate component 116-1, 116-2, and/or 118 may be a same metal selected from one of tungsten (W) and aluminum (Al). The shared same material that provides the function of the metal gate interface component 126 may be a same dielectric selected from one of tantalum nitride (TaN) and titanium nitride (TiN). The shared same material that provides the function of the interface stabilizing material 128 may be a same dielectric selected from one of silicon oxide ($SiO_2$), silicon oxynitride (SiON), and oxygen-rich silicon oxynitride (OR-SiON). The interface stabilizing material may produce and stabilize a threshold of channel formation in the silicon semiconductor material 108 and/or the well 109 (e.g., between source and drain gates 116-1, 116-2). The interface stabilizing material 128 may form a number of electronic bonds with the silicon semiconductor material 108 and/or the well 109. The interface stabilizing material 128 may provide a low interface state density for meeting device parameter objectives for both the FET devices and/or the NVM devices described herein. With regard to P-FET devices 102, for example, a stack design using the metal gate component 118 formed from Al, the metal gate interface component 126 formed from TaN, and a high dielectric constant (k), low leakage material 130 formed from $Al_2O_3$ may provide a low threshold (e.g., of around negative 0.3 Volts).

In a number of embodiments, there may be additional shared same materials that each provides a particular function in the integrated computing structure 100. For example, there may be a shared same high k conductive material (e.g., as shown at 136 for NVM 106) that provides a tunneling function for the NVM device as well as the primary dielectric layers of the FET devices (e.g., as shown at 129 and 132, respectively, for P-FET 102 and N-FET 104). A metal gate interface component 126 may be a shared same intermetallic material for the P-FET 102 and N-FET 104 and for the NVM 106 device. The material of the metal gate interface component 126 may provide work-function control for the FETs, as well as for the NVM device. The shared high k dielectric material 126 for P-FET 102 and N-FET 104 and NVM 106 for the gate insulator stacks may be selected from among several materials that have a dielectric constant that is above 10 (e.g., hafnium lanthanide oxynitride (HfLaON) or hafnium silicon oxynitride (HfSiON) dielectrics, among other such dielectrics).

In addition, there may be a shared same high k material that provides a low leakage (e.g., reduction of charge leakage) function (e.g., as shown at 130 and 134, respectively) in the P-FET 102 and N-FET 104 gate insulator stacks contiguous to the metal gate interface component 126 on a side of the metal gate interface component 126 opposite from the metal gate component 118 and/or the polysilicon cap 262. The shared same material that provides the high k dielectric, low leakage function in the P-FET 102 and N-FET 104 gate insulator stacks may be selected from among materials that have a dielectric constant that is above 6.0 (e.g., aluminum oxide ($Al_2O_3$) dielectric, among other such dielectrics).

The additional shared same materials may, in a number of embodiments, include a shared same material that provides a function to reduce resistance (e.g., of a diffusion contact as an embodiment of an associated component shown at 120-1 and 120-2) in the P-FET 102 and N-FET 104 gate insulator stacks and associated components 110, 112 and in the NVM 106 device stack and associated components 114 contiguous to a base of the source gate and the drain gate (e.g., 116-1 and 116-2). In a number of embodiments, the source gate and the drain gate may each be associated with a well 109 (e.g., as an embodiment of an associated component shown at 122-1 and 122-2 for P-FET 102), while the wells (not shown) for N-FET 104 (e.g., as an embodiment of an associated component shown at 123-1 and 123-2) and/or for NVM 106 (e.g., as an embodiment of an associated component shown at 124-1 and 124-2) may be formed in the silicon semiconductor material 108 (e.g., a p-silicon substrate). Conversely, in a number of embodiments, the source gate and the drain gate for P-FET 102 may be associated with an n-silicon material of the well 109 (e.g., as an embodiment of an associated component shown at 122-1 and 122-2 for P-FET 102). The shared same material that provides the function of the diffusion contacts 120-1, 120-2 may be a same nickel silicide selected from one of NiSi, $Ni_2S_i$, and $N_iS_2$. Using one of these materials may enable an intended (e.g., desired) lower series resistance for the FET devices and NVM memory cell.

In a number of embodiments, the P-FET 102 gate insulator stack may include a second material 129 formed from a HfSiON dielectric to provide a FET gate dielectric function contiguous with and between a first material 128, selected from one of $SiO_2$, SiON, and/or OR-SiON, and a third material 130 (e.g., formed from $Al_2O_3$). In a number of embodiments, the N-FET 104 gate insulator stack may include a second material 132, selected from one of a HfLaON dielectric and a hafnium tantalum oxynitride (HfTaON) dielectric, to provide a high k, low leakage function contiguous with and between the first material 128 and a third material 134, a lanthanum oxide ($La_2O_3$), to provide a FET gate dielectric function.

In a number of embodiments, the NVM 106 device stack may include a third material 138, formed from a $HfO_2$ dielectric to provide a charge trapping function or formed from an injector silicon-rich nitride (In-SRN) dielectric to provide a floating plate function, contiguous with and between the second material 136 and a fourth material 139, selected from one of a HfLaON dielectric and a HfTaON dielectric, to provide a high k blocking function.

Accordingly, a method of forming a semiconductor structure may include forming, on a silicon semiconductor material 108, an integrated computing structure 100. The integrated computing structure 100 may be formed by forming a number of CMOS devices 102, 104, 105, formed from a plurality of materials, and forming a NVM device 106 formed from a plurality of materials. The method includes forming the plurality of materials of the CMOS devices and the plurality of materials of the NVM device from a plurality of same materials shared at a corresponding plurality of positions within the structure, where a particular function is provided by each of the plurality of same materials at the corresponding plurality of positions.

The method may include, as described herein, forming the silicon semiconductor material 108 as a base semiconductor wafer. In a number of embodiments, the silicon semiconductor material 108 may be selected from one of a single crystal silicon structure and a SOI structure. The method may include forming the plurality of materials of the CMOS device 105 as a P-FET 102 gate insulator stack and associated components 110 and an N-FET 104 gate insulator stack and associated components 112. The method may include forming the NVM 106 device stack and associated components 114 as a FET-based device including a charge trapping material 138.

The method may include forming an STI 258 structure between the P-FET 102 gate insulator stack and associated components 110 and the N-FET 104 gate insulator stack and associated components 112 of the CMOS device 105. The method may include forming a DTI structure 260 between the plurality of materials that form a stack and associated components of the NVM device 114 and the plurality of materials that form the gate insulator stacks and associated components 110, 112 of the CMOS device 105.

FIGS. 2A-2C are cross-sectional views of a processing sequence 250 for integration of memory devices and associated structures on and/or in a silicon semiconductor material 208 (e.g., a substrate such as a single crystal silicon wafer and/or a SOI structure) in accordance with a number of embodiments of the present disclosure. As described herein, the processing sequence may be for integration of FET elements of both P-type 102 and N-type 104, as described in connection with FIGS. 1A and 1B, respectively, (e.g., to form an single CMOS 105 logic element) with a single NVM 106 device element, as described in connection with FIG. 1C, on a silicon semiconductor material 208. In a number of embodiments, the memory devices may be the plurality of materials of the P-FET 102 and N-FET 104 gate insulator stacks and regions 110, 112 and the plurality of materials of the NVM 106 device stack and region 114 formed on the silicon material 108 (e.g., a single silicon crystal substrate) shown in and described in connection with FIGS. 1A-1C, respectively.

The materials (e.g., layers) described herein in connection with FIGS. 1A-1C and FIGS. 2A-2C may be formed (e.g., deposited) utilizing a number of deposition techniques. A particular deposition technique may be selected based upon, for example, suitability of the deposition technique in connection with a particular material (e.g., chemical composition) of the layer to be deposited, a thickness, length, and/or width of the layer to be deposited, whether the layer is to be deposited on a horizontal, vertical, and/or slanted surface, and/or a chemical composition of an underlying layer upon which the layer is to be deposited, among other possible considerations. In a number of embodiments, a source of silicon (e.g., silane=$SiH_4$) and a source of nitrogen (e.g., ammonia=$NH_3$) may be used in common for deposition of, for example, SiON and OR-SiON. The particular deposition technique may be selected from a group of such techniques that includes, but is not limited to, chemical vapor deposition (CVD), low pressure CVD (LPCVD), plasma enhanced CVD (PECVD), plasma vapor deposition (PVD), and atomic layer deposition (ALD), among other possible deposition techniques. For a number of embodiments described herein, oxidation and/or nitridation techniques may be performed in association with (e.g., before, during, and/or after) the particular deposition technique. Appropriate annealing techniques also may be performed (e.g., as described herein or otherwise).

Suitable techniques may be utilized for forming and/or removing portions of the plurality of materials (e.g., as shown and described in connection with FIGS. 2A-2C) of a P-FET region 252, an N-FET region 254, and/or an NVM region 256 formed on a single silicon crystal material 208 (e.g., including the isolation trenches of the STI structures 258 and/or the DTI structures 260) to form the integrated computing structures. Such techniques may include etching techniques such as, but not limited to, reactive ion etching (RIE), plasma etching, chemical dry etching, and/or ion beam etching, among other possible etching techniques.

Control and/or direction of which materials (e.g., layers) may be first formed (e.g., deposited) on the single crystal silicon material and/or the SOI structure 208, of which materials may be etched (e.g., removed), may be provided by suitable masking techniques. For etching, part of the silicon material 208 and/or a number of layers formed thereon may be protected from an etchant by a "masking" material that resists etching. The masking utilized herein may, in a number of embodiments, be a photoresist material in combination with a polysilicon cap (e.g., as shown with the cap 262 as a polysilicon hard mask and with photoresist mask 263 and/or with hard mask cap 262 and photoresist mask 264, as described in connection with FIGS. 2A-2C), where the photoresist material layer has been patterned using photolithography. Masking to remove a material (e.g., a layer), as described herein, may be for removal of a particular portion of a previously deposited material and/or for replacement of a particular portion, or all, of a previously removed material. During the processing sequence 250, various portions of a mask (e.g., as shown at 262, 263, and/or 264) may be added and/or removed, as appropriate for the deposition and/or etching performed in the processing sequence 250.

The etch process may be controlled and/or directed by a suitable mask (e.g., as shown at 262, 263, and/or 264) for formation of the STI structure 258 and/or the DRI structure 260 in the silicon material 208. A depth to which etching is performed for the STI structure 258 may range from around 100 nm to around 800 nm. However, other depths may be implemented depending upon, for example, a desired aspect ratio (depth to width) of the opening into the STI structure 258 and/or the silicon material 208. A depth to which etching is performed for the DTI structure 260 may be deeper than that performed for the STI structure 258. For example, the depth may be at least 1000 nm in order to provide suitable isolation of a CMOS device 105 and an NVM device 104 (e.g., isolation of the P-FET region 252 and the N-FET region 254 from the NVM region 256).

Embodiments described herein provide a method of integrating memory structures formed on silicon (e.g., a silicon substrate). An example of such a method may include forming a plurality of materials of a P-FET 102 gate insulator stack in the PFET region 252 (e.g., depositing materials 228, 229, and 230 sequentially on the silicon material 208), forming a plurality of initial materials of an N-FET 104 gate insulator stack in the NFET region 254 (e.g., materials 228, 229, and 230), and forming a plurality of initial materials of an NVM 106 device stack in the NVM region 256 (e.g., materials 228, 229, and 230).

The method may include forming a same number of stacked materials for each of the plurality of materials of the P-FET 102 gate insulator stack, the plurality of initial materials of the N-FET 104 gate insulator stack, and the plurality of initial materials of the NVM 106 device stack. Each stacked material of the same number of stacked materials may extend across an intended position of the P-FET 102 gate insulator stack, the N-FET 104 gate insulator stack, and the NVM 106 device stack (e.g., and across the corresponding regions 252, 254, and 256). Each different (e.g., separate) material of the same number of materials may be formed from a different material than the other materials, although each of the individual, separate materials at the corresponding positions in the stack may be formed from the same material.

For example, in a number of embodiments, forming the plurality of materials of the P-FET 102 and the initial materials of the N-FET 104 gate insulator stacks and the plurality of initial materials of the NVM 106 device stack may include forming a first material 228, selected from one of an $SiO_2$, an SiON, and an OR-SiON dielectric, to provide an interface dielectric function contiguous to the silicon material 208. The method may include forming a second material 229, a HfSiON dielectric, to provide an FET gate dielectric function contiguous with the $SiO_2$, the SiON, or the OR-SiON first material. The method may include forming a third material 230, an $Al_2O_3$ dielectric, to provide a high k low leakage and/or blocking function contiguous with one of the HfLaON or the HfSiON second materials on one side. The method may include forming a polysilicon cap 262 on an opposite side of the $Al_2O_3$ third material to provide an interface (e.g., protective) function to the plurality of integrated computing devices formed on the silicon material 208.

The method may include forming the STI structure 258 and the DTI structure 260 in the silicon material 208 prior to forming the plurality of materials of the P-FET 102 gate insulator stack, the plurality of initial materials of the N-FET 104 gate insulator stack, and the plurality of initial materials of the NVM 106 device stack. In a number of embodiments, the well 109 shown in FIG. 1A may be an n-silicon material formed on the silicon material 108 (e.g., the p-silicon substrate) and between the silicon material 108 and the interface stabilizing material 128 of the gate insulator stack 110 of the P-FET device 102. The well 109 may be formed on the silicon material 108 before or after formation of the STI 258 and DTI 260 structures, although the well 109 is formed prior to forming the plurality of materials of the P-FET gate insulator stack 110 thereon. Processing of the n-silicon material 109 shown in FIG. 1A and the p-silicon material 108 shown in FIGS. 1B and 1C may, in a number of embodiments, be performed after formation of the STI 258 and DTI 260 structures (e.g., processing for planarization of an upper surface of the n-silicon material 109, the p-silicon material 108, and/or the STI 258 and DTI 260 structures and/or for formation of the diffusion contacts 120 and/or the source gate wells and the drain gate wells 122, 123, and 124 shown in and described in connection with FIGS. 1A-1C, among other processing operations).

Following the formation of STI 258 and DTI 260 structures, the dielectric layers for the P-FET 102 device (e.g., layers 228, 229, and 230) may be deposited over the well 109 formed on the silicon substrate 108 followed by deposition of the polysilicon cap layer 262 and a photoresist layer 263. The photoresist layer 263 may be formed over the cap 262 to define and protect the P-FET gate dielectric layers 228, 229, and 230 in P-FET region 252, while some of those layers may optionally be removed from the other regions (e.g., N-FET region 254 and/or NVM region 256). The method as shown in FIG. 2A may only protect the P-FET region 252 defined by the mask 262, 263. Subsequently, the gate dielectric layers for N-FET 104 device and the common layers for NVM 106 device may be deposited, with the polysilicon cap 262 and another photoresist layer 264 being used to define and protect both N-FET and P-FET regions 252, 254, as shown in FIG. 2B. The method protects the gate stack insulators for both the P-FET and N-FET regions 252, 254 and the STI 258 and may partially overlap the isolation region of DTI 260. Similar process steps may be repeated into the NVM region 260 to define the dielectric stack layers of NVM region as shown in FIG. 2C. The polysilicon cap 262 may be utilized over selected regions to protect dielectric layers in the active regions both for FETs and for NVMs.

The plurality of materials of the P-FET 102 gate insulator stack and the plurality of initial materials of the N-FET 104 gate insulator stack may be removed (e.g., by etching in combination with mask 262, 263) from above the STI structure 258 to form the P-FET 102 gate insulator stack and region 252 and to contribute to isolation of the P-FET gate insulator stack and region from the N-FET 104 gate insulator stack and region 254. The method may include removing an upper material 230 (e.g., by etching in combination with mask 262, 263) of the plurality of initial materials of the N-FET 104 gate insulator stack and forming a different material 234 in place of the removed upper material 230. Removing the upper material 230 of the plurality of initial materials of the N-FET 104 gate insulator stack may include removing the third material 230 formed from the $Al_2O_3$ dielectric. Forming the material from the different material in place of the removed upper material 230 may include forming a third material 234 from the $La_2O_3$ dielectric to provide a FET gate dielectric in place of the removed $Al_2O_3$ dielectric. In a number of embodiments, the method may include removing the second material 229 formed from the HfSiON dielectric and forming a second material 232, selected from one of the HfLaON dielectric and the HfTaON dielectric, to provide a high k low leakage function in place of the removed HfSiON dielectric.

The method may include removing (e.g., by etching in combination with mask 262, 264) the plurality of materials of the N-FET 104 gate insulator stack and the plurality of initial materials of the NVM 106 device stack from above the DTI structure 260 to form the N-FET 104 gate insulator stack and region 254 and to contribute to isolation of the N-FET gate insulator stack and region from the NVM 106 device stack and region 256. In a number of embodiments, replacement of the original third material 230 with the different third material 234 and/or the original second material 229 with the different second material 232 for the N-FET 104 gate insulator stack may include forming the different third material 234 and/or the different second material 232 over the original first material 228 in place of a removed original third material 230 and/or the original second material 229 for both the N-FET 104 gate insulator stack and region 254 and the NVM 106 device stack and region 256.

The method may include removing an upper material 230 of the plurality of initial materials of the NVM 106 device stack or a replaced upper material 234 of the N-FET 104 gate insulator stack and forming a different material in place of the removed upper material. Removing the upper material 230 of the plurality of initial materials of the NVM 106 device stack may include removing the third material 230 formed from the $Al_2O_3$ dielectric. Removing the upper material 234 of the replacement material of the NVM 106 device stack may include removing the third material 234 formed from the $La_2O_3$ dielectric. Forming the different material in place of the removed upper material 230, 234 may include forming a third material 238, selected from one of the HfLaON dielectric and the HfTaON dielectric, to provide a high k blocking function in place of the removed $Al_2O_3$ dielectric or the removed $La_2O_3$ dielectric.

The method may include removing a second material 229 of the plurality of initial materials of the NVM 106 device stack or a replaced second material 232 of the N-FET 104 gate insulator stack and forming a different material in place of the removed second material. Removing the second material 229 of the plurality of initial materials of the NVM 106 device stack may include removing the second material 229 formed from the HfSiON dielectric. Removing the second material 232 of the replacement material of the NVM 106 device stack may include removing the second material 232 formed from the HfLaON dielectric or the HfTaON dielectric. Forming the different material in place of the removed second material 229, 232 may include forming a second material 236, the $HfO_2$ dielectric, to provide a charge trapping function or the In-SRN dielectric to provide a floating plate function in place of the removed HfSiON, HfLaON, and/or HfTaON dielectrics. The second material 236 may, in a number of embodiments, be formed on the initially formed first material 228 formed from the $SiO_2$, SiON, or OR-SiON dielectrics.

The method may include forming, in the silicon material 208 and/or the well 109, a diffusion contact (e.g., as an associated component shown at 120-1 and 120-2 and described in connection with FIGS. 1A-1C) from a nickel silicide (e.g., NiSi, $Ni_2S_i$, or $N_iS_2$). The diffusion contacts may be formed from the nickel silicide to reduce resistance associated with and/or between a source gate well and a drain gate well (e.g., as shown at 122-1 and 122-2, at 123-1 and 123-2, and/or at 124-1 and 124-2 and described in connection with FIGS. 1A-1C) for the P-FET 102 and N-FET 104 gate insulator stacks and regions 252, 254 and for the NVM 105 device stack and region 256. The method may include forming, from one of W and Al, a metal gate (e.g., as an associated component shown at 116-1 and described in connection with FIGS. 1A-1C) in contact with the source gate diffusion contact (e.g., diffusion contact 120-1) and a metal gate (e.g., as an associated component shown at 116-2) in contact with a drain gate diffusion contact (e.g., diffusion contact 120-2) of each of the P-FET 102 and N-FET 104 gate insulator stacks and the NVM 106 device stack.

At appropriate times during the method just described and/or after completion thereof, the polysilicon cap 262 as the hard mask and/or the photoresist mask 263, 264 may be added to and/or removed. For example, after completion of the deposition and/or etching performed in the processing sequence 250, protection of the dielectric layers of the P-FET region 252, the N-FET region 254, and the NVM region 256, and/or the STI and/or DTI trench structures 258, 260, provided by the polysilicon cap 262 and/or the photoresist masks 263, 264 may be removed. Removal of the polysilicon cap 262 and/or the photoresist masks 263, 264 may enable access to the underlying integrated computing structures for further processing operations. For example, the polysilicon cap 262 and/or the photoresist masks 263, 264 may be removed to enable formation of the diffusion contacts 120, the source gate wells and the drain gate wells 122, 123, and 124, and/or the metal gates 116-1, 116-2, and/or 118 associated with an upper surface of the n-silicon of well 109 and/or the p-silicon of silicon material 108, among other processing operations).

The method may include annealing the integrated computing structure 100 after forming the metal gate in contact with the source gate diffusion contact and the metal gate in contact with the drain gate diffusion contact. In a number of embodiments, annealing can be performed in an inert gas atmosphere (e.g., nitrogen, argon, helium and the like), which may or may not be mixed with oxygen. One example of an atmosphere employed in the annealing step of the present disclosure may include steam at a temperature about 600° Celsius (C) to about 700° C. for a time interval from about 30 to about 120 seconds. In another example, the atmosphere employed for the annealing step may be steam at a temperature from about 75° C. to about 600° C. for a time interval from about 30 to about 120 seconds. The annealing may be performed in a single ramp step or it can be performed using a series of ramp and soak cycles.

While example embodiments including various combinations and configurations of semiconductor structures for integrated computing structures formed on silicon have been illustrated and described herein, embodiments of the present disclosure are not limited to those combinations explicitly recited herein. Other combinations and configurations of the semiconductor structures for integrated computing structures formed on silicon disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor structure, comprising:
   a silicon semiconductor material comprising an integrated computing structure formed thereon; and
   wherein a plurality of devices in the integrated computing structure comprises:
      a p-channel field effect transistor (P-FET) that comprises a plurality of materials of a gate insulator stack and associated components;
      an n-channel FET (N-FET) that comprises a plurality of materials of a gate insulator stack and associated components; and
      a non-volatile memory (NVM) device that comprises a plurality of materials of a device stack and associated components;
   wherein the plurality of materials of the P-FET and N-FET gate insulator stacks and associated components and the plurality of materials of the NVM device stack and associated components share a plurality of same materials at a plurality of corresponding positions within the structure to provide a particular function in all of:
      an interface stabilizing material of the stacks contiguous to the silicon semiconductor material;
      a metal gate interface component contiguous to a metal gate component distal from the silicon semiconductor material and between the interface stabilizing material and the metal gate component; and
      a dielectric material with a high dielectric constant configured to provide a tunneling function formed contiguous to the interface stabilizing material and between the metal gate interface component and the interface stabilizing material, wherein the dielectric material is different from the interface stabilizing material.

2. The semiconductor structure of claim 1, wherein the metal gate component comprises:
   a control gate component of each of the P-FET and N-FET gate insulator stacks and the NVM device stack; and
   a source gate component and a drain gate component of each of the P-FET and N-FET gate insulator stacks and the NVM device stack.

3. The semiconductor structure of claim 1, wherein a shared same material that provides a function of the metal gate component is a same metal selected from one of tungsten (W) and aluminum (Al).

4. The semiconductor structure of claim 1, wherein a shared same material that provides a function of the metal gate interface component is a same conductor selected from one of tantalum nitride (TaN) and titanium nitride (TiN).

5. The semiconductor structure of claim 1, wherein a shared same material that provides a function of the interface stabilizing material is a same dielectric selected from one of silicon oxide ($SiO_2$), silicon oxynitride (SiON), and oxygen-rich silicon oxynitride (OR-SiON) that produces and stabilizes a threshold of channel formation in the silicon semiconductor material.

6. The semiconductor structure of claim 1, further comprising a shared same high dielectric constant (k) material that provides a low leakage function in the P-FET and N-FET gate insulator stacks contiguous to the metal gate interface component on a side of the metal gate interface component opposite from the metal gate component.

7. The semiconductor structure of claim 6, wherein the shared same high k material that provides the low leakage function is an aluminum oxide ($Al_2O_3$) dielectric.

8. The semiconductor structure of claim 1, further comprising:
   a shared same material that provides a function of a diffusion contact to reduce resistance in the P-FET and N-FET components and in the NVM device components contiguous to a base of a source gate and a drain gate; and
   wherein the source gate and the drain gate are each associated with a well formed in the silicon semiconductor material.

9. The semiconductor structure of claim 8, wherein the shared same material is a same nickel silicide selected from one of NiSi, $Ni_2S_i$, and $N_iS_2$.

10. The semiconductor structure of claim 1, wherein:
    the P-FET gate insulator stack and associated components comprising the plurality of materials and the N-FET gate insulator stack and associated components comprising the plurality of materials are coupled as a complementary metal-oxide-semiconductor (CMOS) device configured to perform logical operations; and
    the NVM device stack and associated components comprising the plurality of materials is configured for non-volatile storage of data values.

11. A method of forming a semiconductor structure, comprising:
    forming a silicon semiconductor material comprising an integrated computing structure formed thereon;
    wherein a plurality of devices in the integrated computing structure comprises:
       forming a p-channel field effect transistor (P-FET) that comprises a plurality of materials of a gate insulator stack and associated components;
       forming an n-channel FET (N-FET) that comprises a plurality of materials of a gate insulator stack and associated components; and
       forming a non-volatile memory (NVM) device that comprises a plurality of materials of a device stack and associated components;
    wherein the plurality of materials of the P-FET and N-FET gate insulator stacks and associated components and the plurality of materials of the NVM device stack and associated components share a plurality of same materials at a plurality of corresponding positions within the structure to provide a particular function in all of:
       an interface stabilizing material of the stacks contiguous to the silicon semiconductor material;
       a metal gate interface component contiguous to a metal gate component distal from the silicon semiconductor material and between the interface stabilizing material and the metal gate component; and
       a dielectric material with a high dielectric constant configured to provide a tunneling function formed contiguous to the interface stabilizing material and between the metal gate interface component and the interface stabilizing material, wherein the dielectric material is different from the interface stabilizing material.

12. The method of claim 11, wherein the metal gate component comprises:
   forming a control gate component of each of the P-FET and N-FET gate insulator stacks and the NVM device stack; and
   forming a source gate component and a drain gate component of each of the P-FET and N-FET gate insulator stacks and the NVM device stack.

13. The method of claim 11, further comprising selecting a same metal as a shared same material that provides a function of the metal gate component from one of tungsten (W) and aluminum (Al).

14. The method of claim 11, further comprising selecting a same conductor as a shared same material that provides a function of the metal gate interface component from one of tantalum nitride (TaN) and titanium nitride (TiN).

15. The method of claim 11, further comprising selecting a same dielectric as a shared same material that provides a function of the interface stabilizing material from one of silicon oxide ($SiO_2$), silicon oxynitride (SiON), and oxygen-rich silicon oxynitride (OR-SiON) to produce and stabilize a threshold of channel formation in the silicon semiconductor material.

16. The method of claim 11, further comprising forming a shared same high dielectric constant (k) material that provides a low leakage function in the P-FET and N-FET gate insulator stacks contiguous to the metal gate interface component on a side of the metal gate interface component opposite from the metal gate component.

17. The method of claim 16, further comprising forming the shared same high k material that provides the low leakage function from an aluminum oxide ($Al_2O_3$) dielectric.

18. The method of claim 11, further comprising:
   forming a shared same material that provides a function of a diffusion contact to reduce resistance in the P-FET and N-FET components and in the NVM device components contiguous to a base of a source gate and a drain gate;
   wherein the source gate and the drain gate are each associated with a well formed in the silicon semiconductor material.

19. The method of claim 18, further comprising selecting the shared same material as a same nickel silicide from one of NiSi, $Ni_2S_i$, and $N_iS_2$.

20. The method of claim 11, further comprising:
   coupling the P-FET gate insulator stack and associated components comprising the plurality of materials and the N-FET gate insulator stack and associated components comprising the plurality of materials as a complementary metal-oxide-semiconductor (CMOS) device configured to perform logical operations;
   wherein the NVM device stack and associated components comprising the plurality of materials is configured for non-volatile storage of data values.

* * * * *